(12) United States Patent
Volk et al.

(10) Patent No.: US 9,431,349 B2
(45) Date of Patent: Aug. 30, 2016

(54) RULE CLEAN LAYER MARKER

(71) Applicant: GLOBALFOUNDRIES Inc., Grand Cayman (KY)

(72) Inventors: Peter Benjamin Volk, Dresden (DE); Michael Ronald Otto, Dresden Saxony (DE); Christoph Rainer Gerhard Mueller, Dresden Saxony (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/536,028

(22) Filed: Nov. 7, 2014

(65) Prior Publication Data

US 2016/0133578 A1   May 12, 2016

(51) Int. Cl.
*G06K 19/00* (2006.01)
*H01L 23/544* (2006.01)
*H01L 21/02* (2006.01)
*G06K 7/14* (2006.01)

(52) U.S. Cl.
CPC ........... *H01L 23/544* (2013.01); *G06K 7/1417* (2013.01); *H01L 21/02107* (2013.01)

(58) Field of Classification Search
USPC ................. 235/435, 439, 454, 462
See application file for complete search history.

(56) References Cited

U.S. PATENT DOCUMENTS

| 2002/0036235 A1* | 3/2002 | Kudo | G06K 1/126 235/462.01 |
| 2009/0212379 A1* | 8/2009 | Kitamura | H01L 27/14627 257/432 |
| 2009/0238626 A1* | 9/2009 | Ming | G07D 7/0026 400/76 |

* cited by examiner

*Primary Examiner* — Matthew Mikels
(74) *Attorney, Agent, or Firm* — Ditthavong & Steiner, P.C.

(57) ABSTRACT

A method and apparatus for including human readable text in a semiconductor design which is both machine readable for printing on a wafer and human readable from the wafer are disclosed that are design rule clean depending on the layer to be printed. Embodiments include receiving a semiconductor design including a layer marker, the layer marker including human readable text; transforming the human readable text to a binary representation; transforming the binary representation to a machine readable two-dimensional barcode; and printing the two-dimensional barcode on a semiconductor wafer.

20 Claims, 3 Drawing Sheets

RULE CLEAN LAYER MARKER

TECHNICAL FIELD

The present disclosure relates to semiconductor wafer layer markers. The present disclosure is particularly applicable to text markers for identifying if semiconductor layers have been printed or to identify the layer that is currently being analyzed.

BACKGROUND

Every design to be printed on a semiconductor wafer includes layer markers, for example to identify if each layer has actually been printed or to identify the layer that is currently being analyzed. However, the layer markers often include human readable texts, such as illustrated in FIG. 1, which potentially violate design rules. More specifically, design rules require specific geometry restrictions, such as but not limited to: no 45° angles, no intersecting or overlapping shapes, and no shapes with zero area, as these can cause a higher defect count. Since these restrictions are not maintainable for all designs, waivers have been predefined for a specific set of restrictions for text markers in the design manual.

A common approach to make texts design rule clean involves changing the font of the text. However, the modified text design may then be unreadable to the wafer technician or still not be design rule clean. Additionally the text is not machine readable.

A need therefore exists for methodology and apparatus enabling forming layer markers which include text which are both design rule clean and also human readable.

SUMMARY

An aspect of the present disclosure is a method of transforming a human readable text to a machine readable code for printing on a semiconductor wafer.

Another aspect of the present disclosure is a method of transforming a machine readable representation of a human readable text back to the human readable text.

Another aspect of the present disclosure is a method of transforming a machine readable representation of a human readable text to a Design Rule clean machine readable code.

Another aspect of the present disclosure is an apparatus including a decoding device between a viewer and a semiconductor wafer including a machine readable representation of a human readable text, in which the decoding device transforms the machine readable representation back to the human readable text.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: receiving a semiconductor design including a layer marker, the layer marker including human readable text; transforming the human readable text to a binary representation; transforming the binary representation to a machine readable two-dimensional barcode; and printing the two-dimensional barcode on a semiconductor wafer.

Aspects of the present disclosure include the two-dimensional barcode including a two-dimensional organization of dots and lines. Further aspects include the number of lines exceeding the number of dots and the semiconductor design including a metal layer design. Other aspects include the number of dots exceeds the number of lines and the semiconductor design including a contact layer design. Another aspect includes including redundancies in the two-dimensional barcode. An additional aspect includes the human readable text including 45° angles. Further aspects include viewing the printed two-dimensional barcode through a microscope, the microscope including a decoding device between the two-dimensional barcode and the viewer for transforming the two-dimensional barcode back to a human readable text.

Another aspect of the present disclosure is a method including placing under a microscope a semiconductor wafer including a layer marker, the layer marker comprising a machine readable two-dimensional barcode, the barcode representing a human readable text; viewing the semiconductor wafer through a decoding apparatus in the microscope; and reading the two-dimensional barcode as the human readable text.

Another aspect of the present disclosure is an apparatus including: a light source; a wafer holder; a magnification lens; a decoding device, wherein the decoding device transforms a machine readable two-dimensional barcode representation of a human readable text to the human readable text.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of semiconductor layer markers either violating design rules or being unreadable by humans attendant upon forming the layer markers with alphanumeric text. In accordance with embodiments of the present disclosure, the text is encoded to be design rule clear prior to printing the layer marker on the semiconductor wafer and is decoded to again be human readable in the apparatus for viewing the layer marker.

Methodology in accordance with embodiments of the present disclosure includes receiving a semiconductor design including a layer marker, the layer marker including human readable text. The human readable text is transformed to a binary representation, and then the binary representation is transformed to a machine readable two-dimensional barcode. The two-dimensional barcode is then printed on a semiconductor wafer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
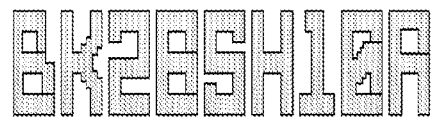
FIG. 1 schematically illustrates a layer marker with a potentially design rule violating text.
Figure 2A:
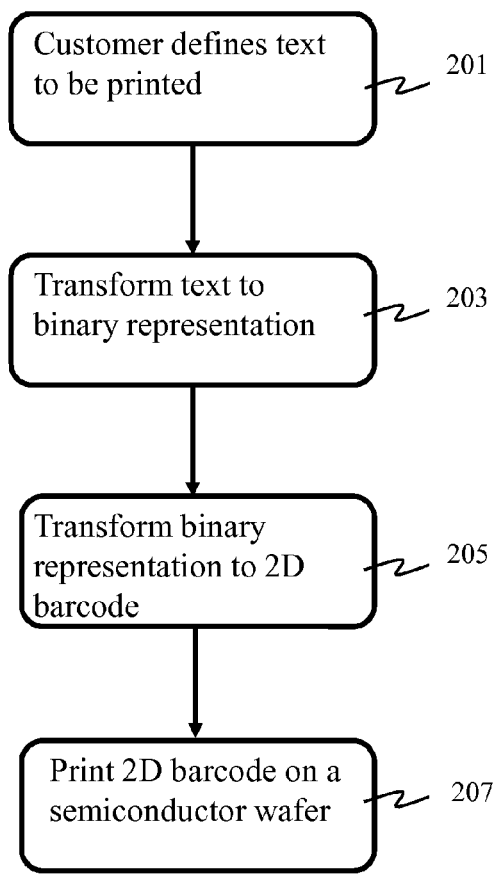
FIG. 2A illustrates a process flow for converting a human readable text to a machine readable text to be printed, in accordance with an exemplary embodiment.
Figure 2B:
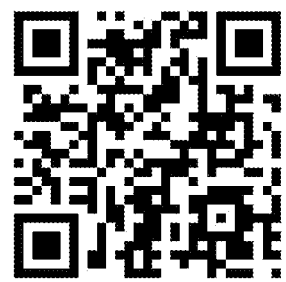
FIG. 2B illustrates a 2-dimensional barcode to be printed on a semiconductor wafer, in accordance with an exemplary embodiment.

FIG. 2A shows a process flow for converting a human readable text, which may include portions that are not printable on a semiconductor wafer, to a machine readable text that is printable on a semiconductor wafer, in accordance with an exemplary embodiment. Adverting to FIG. 2A, in step 201, a customer defines text to be printed, for example for layer markers, which includes portions which violate design rules, such the text shown in FIG. 1. Next, in step 203, the text is transformed to a binary representation. The binary representation of the original text is then transformed into a 2-dimensional barcode of dots and lines, as shown in step 205. The barcode is a design rule clean code (i.e., it violates no design rules) that is machine readable. Also, the barcodes includes redundancies according to standard CS rules to perform error corrections to compensate for errors that arise during manufacturing, such as a missing pixel in the representation. An example of a 2-dimensional barcode in accordance with an exemplary embodiment is shown in FIG. 2B. The resulting barcode is then printed on a semiconductor wafer in step 207.

Figure 3:
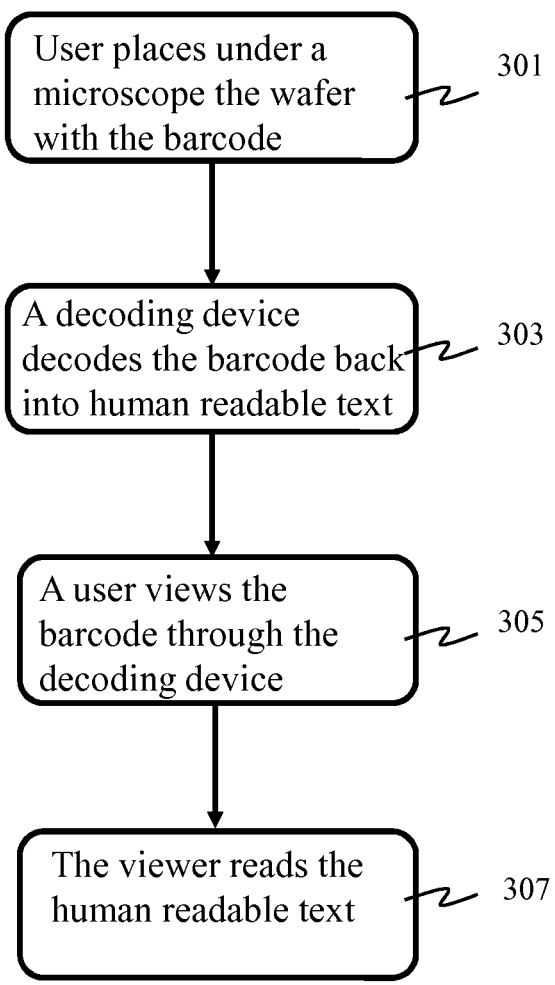
FIG. 3 illustrates a process flow for reading the printed barcode as human readable text, in accordance with an exemplary embodiment.
Figure 4:
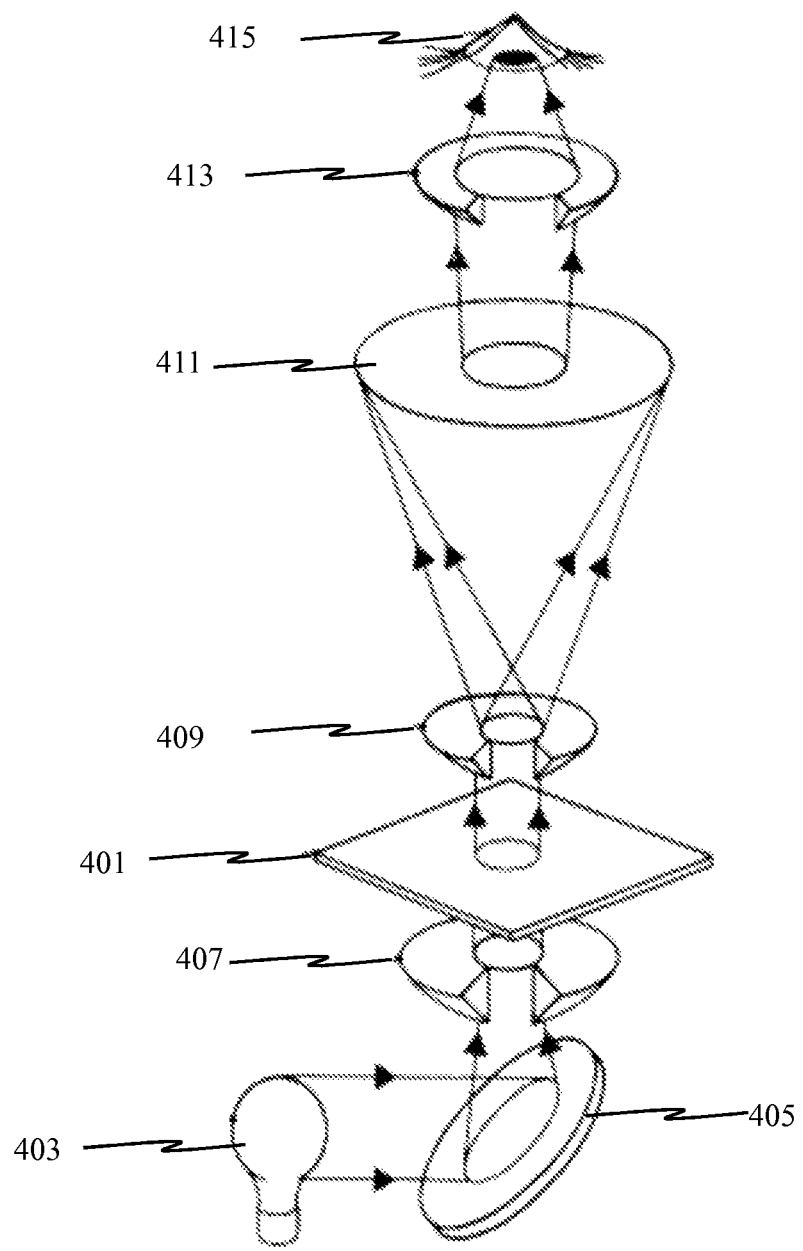
FIG. 4 schematically illustrates a microscope for viewing the printed barcode as human readable text, in accordance with an exemplary embodiment.

Adverting to FIGS. 3 and 4, a process flow for reading the printed barcode as human readable text and the microscope for viewing the text, respectively, are shown, in accordance with an exemplary embodiment. The process begins at step 301 with placing the wafer with the 2-dimensional barcode under the microscope illustrated in FIG. 4. The wafer is placed in the middle of a wafer holder 401. A light source 403 is reflected at 405 and focused through light focus 407 to backlight the wafer. A magnifying lens 409 and collimator 411 focus the backlit image from the wafer onto a decoding device 413. At step 303, the decoding device 413 decodes the 2-dimensional barcode and transforms it back into the original human readable text. A user 415 views the wafer with the 2-dimensional barcode through decoding device 413, at step 305, and reads the barcode as the original human readable text, at step 307.

The embodiments of the present disclosure can achieve several technical effects, such as using a text in semiconductor design, e.g. in a layer marker, which includes design rule violations but can still be read by a machine and printed on the semiconductor wafer and also read from the wafer by a user without losing encoded information. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   receiving a semiconductor design including a layer marker, the layer marker including human readable text;
   transforming, in a text-to-binary converter, the human readable text to a binary representation;
   transforming, in a binary-to-barcode converter, the binary representation to a machine readable two-dimensional barcode; and
   printing the two-dimensional barcode on a semiconductor wafer.

2. The method according to claim 1, wherein the two-dimensional barcode comprises a two-dimensional organization of dots and lines.

3. The method according to claim 2, wherein the number of lines exceeds the number of dots.

4. The method according to claim 3, wherein the semiconductor design comprises a metal layer design.

5. The method according to claim 2, wherein the number of dots exceeds the number of lines.

6. The method according to claim 5, wherein the semiconductor design comprises a contact layer design.

7. The method according to claim 1, further comprising including redundancies in the two-dimensional barcode.

8. The method according to claim 1, wherein the human readable text includes 45° angles.

9. The method according to claim 1, further comprising viewing the printed two-dimensional barcode through a microscope, the microscope comprising a decoding device between the two-dimensional barcode and the viewer for transforming the two-dimensional barcode back to a human readable text.

10. A method comprising:
    placing under a microscope a semiconductor wafer including a layer marker, the layer marker comprising a machine readable two-dimensional barcode, the barcode representing a human readable text;

viewing the semiconductor wafer through a decoding apparatus in the microscope, wherein the decoding apparatus transforms the two-dimensional barcode into human readable text; and reading the two-dimensional barcode as the human readable text.

11. The method according to claim 10, wherein the two-dimensional barcode comprises a two-dimensional organization of dots and lines.

12. The method according to claim 11, wherein the number of lines exceeds the number of dots.

13. The method according to claim 12, wherein the semiconductor design comprises a metal layer design.

14. The method according to claim 11, wherein the number of dots exceeds the number of lines.

15. The method according to claim 14, wherein the semiconductor design comprises a contact layer design.

16. The method according to claim 10, further comprising including redundancies in the two-dimensional barcode.

17. The method according to claim 10, wherein the human readable text includes 45° angles.

18. An apparatus comprising:
a light source;
a wafer holder;
a magnification lens;
a decoding device, wherein the decoding device transforms a machine readable two-dimensional barcode representation of a human readable text to the human readable text.

19. The apparatus according to claim 18, wherein the two-dimensional barcode comprises a two-dimensional organization of dots and lines, wherein the number of lines exceeds the number of dots, and wherein the semiconductor design comprises a metal layer design.

20. The apparatus according to claim 18, wherein the two-dimensional barcode comprises a two-dimensional organization of dots and lines, wherein the number of dots exceeds the number of lines, and wherein the semiconductor design comprises a contact layer design.

* * * * *